(12) United States Patent
Murayama

(10) Patent No.: US 7,034,255 B2
(45) Date of Patent: Apr. 25, 2006

(54) LIGHT IRRADIATION TYPE THERMAL PROCESSING APPARATUS

(75) Inventor: Hiromi Murayama, Kamikyo-ku (JP)

(73) Assignee: Dainippon Screen Mfg., Co. Ltd., (JP)

( * ) Notice: Subject to any disclaimer, the term of this patent is extended or adjusted under 35 U.S.C. 154(b) by 66 days.

(21) Appl. No.: 10/825,275

(22) Filed: Apr. 14, 2004

(65) Prior Publication Data
US 2004/0206743 A1    Oct. 21, 2004

(30) Foreign Application Priority Data
Apr. 16, 2003   (JP) ............................. 2003-111558

(51) Int. Cl.
*F27B 5/14* (2006.01)
(52) U.S. Cl. ...................... 219/390; 219/405; 219/411; 392/416; 392/418; 118/724; 118/725; 118/50.1
(58) Field of Classification Search ................ 219/390, 219/405, 411; 392/416, 418; 118/724, 725, 118/50.1, 728, 729, 730
See application file for complete search history.

(56) References Cited

U.S. PATENT DOCUMENTS

| 4,540,876 | A | * | 9/1985 | McGinty ..................... 219/405 |
| 4,571,486 | A | | 2/1986 | Arai et al. |
| 4,649,261 | A | | 3/1987 | Sheets |
| 4,698,486 | A | * | 10/1987 | Sheets ......................... 219/390 |
| 5,414,244 | A | * | 5/1995 | Imahashi ..................... 219/497 |
| 6,143,081 | A | * | 11/2000 | Shinriki et al. ............. 118/719 |

FOREIGN PATENT DOCUMENTS

| JP | 57-162340 | 10/1982 |
| JP | 59-169125 | 9/1984 |
| JP | 60-258928 | 12/1985 |
| JP | 63-166219 | 7/1988 |
| JP | 9-263939 | 10/1997 |
| JP | 2000-223547 | 8/2000 |
| JP | 2001-237195 | 8/2001 |

* cited by examiner

*Primary Examiner*—Shawntina Fuqua
(74) *Attorney, Agent, or Firm*—Ostrolenk, Faber, Gerb & Soffen, LLP

(57) ABSTRACT

A lamp house stores twenty-seven flash lamps in such a state that a longitudinal direction of each of the twenty-seven flash lamps extends in a horizontal direction (Y-direction), and that the twenty-seven flash lamps are arranged in parallel to one another at equally spaced intervals in a horizontal direction (X-direction) perpendicular to the longitudinal direction. There is employed such a layout that a direction of substrate loading and unloading by a transport robot is perpendicular to the longitudinal direction of the flash lamps (the longitudinal direction of the lamp house). In this layout, the distance required for the transport robot to transfer a semiconductor wafer by slidingly moving a transport arm can be minimized to permit a compact transport robot, so that a thermal processing apparatus itself is compact and excellent in maintainability.

10 Claims, 6 Drawing Sheets

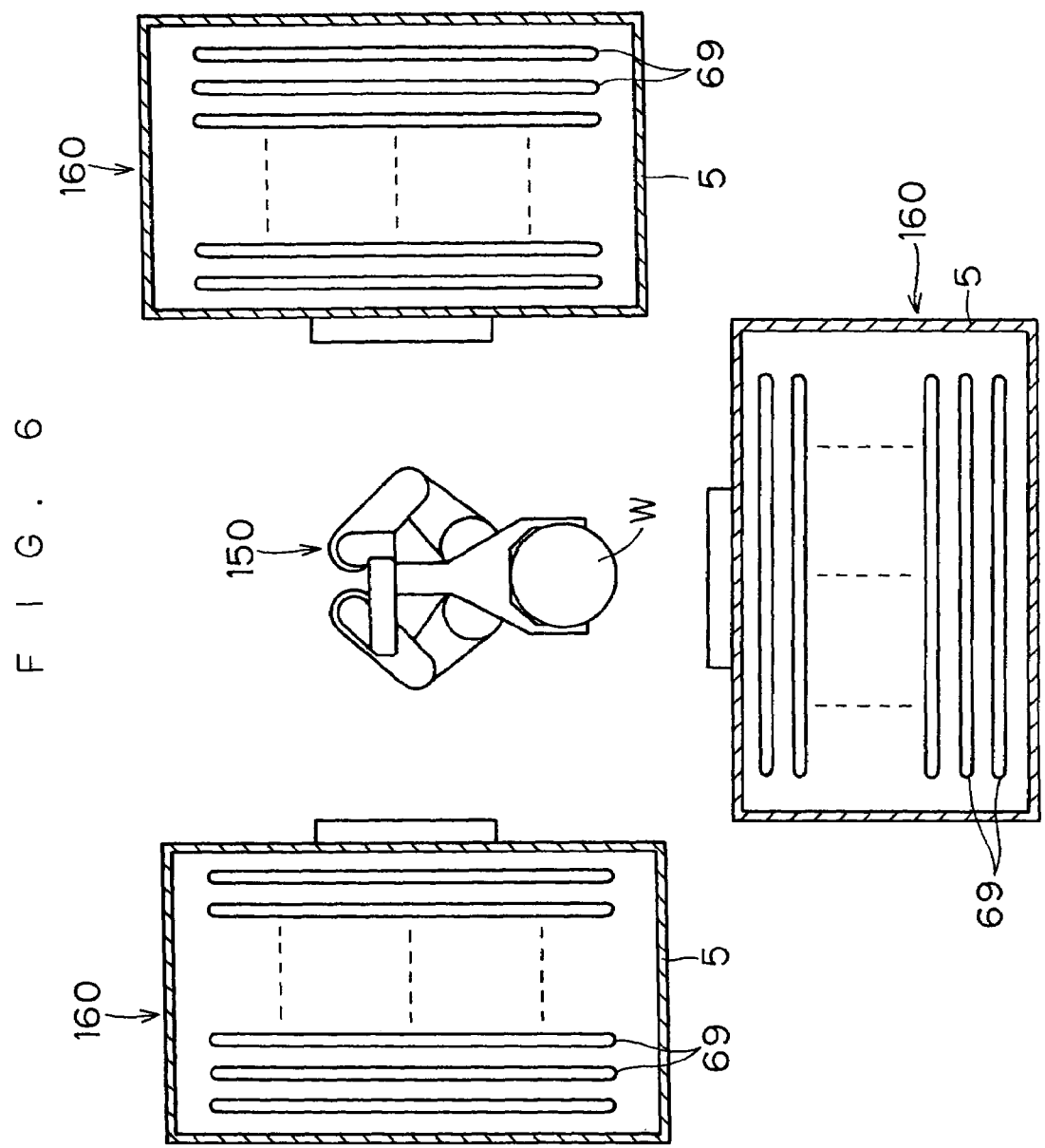

LIGHT IRRADIATION TYPE THERMAL PROCESSING APPARATUS

BACKGROUND OF THE INVENTION

1. Field of the Invention

The present invention relates to a thermal processing apparatus that performs thermal processing of a semiconductor wafer and a glass substrate, etc. (hereinafter referred to simply as a "substrate") by irradiating flashlight to the substrate.

2. Description of the Background Art

In an ion activation step of a semiconductor wafer after being subjected to ion implantation, there has heretofore been employed a thermal processing apparatus such as a lamp annealing apparatus using halogen lamps. In such a thermal processing apparatus, the ion activation of a semiconductor wafer is carried out by heating (annealing) the semiconductor wafer to temperatures of, for example, approximately 1000° C. to 1100° C. This thermal processing apparatus is configured so as to elevate the temperature of the substrate at a speed of about several hundreds of degrees per second, by utilizing the energy of light irradiated from the halogen lamps.

Japanese Patent Application Laid-Open No. 2000-223547 discloses this type of lamp annealing apparatus. In this apparatus, thermal processing is performed within a chamber in which a large number of halogen lamps that are usually point light sources are arranged, and a transport robot loads and unloads a substrate with respect to the chamber. Japanese Patent Application Laid-Open No. 9-263939 (1997) discloses a thermal processing apparatus using a tubular infrared lamp heater, in which the direction of substrate transport by a guided vehicle is set parallel to the, longitudinal direction of the infrared lamp heater.

However, even when the ion activation of a semiconductor wafer is executed by using a thermal processing apparatus that elevates the temperature of a substrate at a speed of about several hundreds of degrees per second, the profile of ions implanted into the semiconductor wafer becomes round. That is, it has been found to cause the phenomenon that ions diffuse by heat. In the event that this phenomenon occurs, even if ions are implanted at a high concentration into the semiconductor wafer surface, the implanted ions may diffuse. This introduces the problem that it is necessary to implant more ions than necessary.

In order to solve the above problem, for example, Japanese Patent Application Laid-Open Nos. 59-169125 (1984) and 63-166219 (1988) have proposed a technique of elevating only the temperature of the surface of a semiconductor wafer after being subjected to ion implantation in an extremely short period of time (not exceeding several milliseconds) by irradiating flashlight to the surface of the semiconductor wafer by use of xenon flash lamps, etc. Under the temperature elevation in a very short time by the xenon flash lamps, the ions will not have a sufficient time to diffuse. It is therefore possible to execute only the ion activation, without rounding the profile of ions implanted into the wafer.

However, although the infrared lamp heater exerts uniform output characteristics in the longitudinal direction, the xenon flash lamps, the luminous principle of which is completely different, cannot exert uniform output characteristics in the longitudinal direction. That is, in the xenon flash lamp a predetermined luminous intensity is obtainable only in a portion in the vicinity of the center. For this reason, in order to ensure the necessary effective irradiation region, it is unavoidable to use xenon flash lamps of considerable length. This might enlarge the overall size of the thermal processing apparatus.

Since processing apparatuses for semiconductor wafers and the like are usually disposed in a clean room, the increased size of the apparatus is a problem. In order to improve the production efficiency of a processing apparatus, it is also important that the processing apparatus is excellent in maintainability.

SUMMARY OF THE INVENTION

The present invention is directed to a thermal processing apparatus for heating a substrate by irradiating flashlight to the substrate.

According to one aspect of the present invention, a thermal processing apparatus includes a plurality of bar-like flash lamps, each of which has an elongated cylindrical shape; a lamp house for storing the plurality of flash lamps in such a state that a longitudinal direction of each of the plurality of flash lamps extends in a substantially horizontal direction, and that the plurality of flash lamps are arranged in parallel in a substantially horizontal direction that is substantially perpendicular to the longitudinal direction; a chamber for storing a substrate and being disposed below the lamp house; and a transport robot for loading and unloading a substrate by advancing and retracting a transport arm with respect to the chamber. The lamp house is disposed such that a direction of substrate loading and unloading by the transport robot is substantially perpendicular to the longitudinal direction.

The stroke of the transport arm to the effective irradiation region of the flash lamps can be minimized, and substrate loading and unloading with respect to the effective irradiation region is executable without increasing the size of the transport robot and incorporating part of the transport robot into the chamber. This results in the thermal processing apparatus that is compact and excellent in maintainability.

Preferably, the plurality of flash lamps are xenon flash lamps.

For xenon flash lamps, it is necessary to maximize their longitudinal direction in order to ensure the necessary effective irradiation region. For the reason for this, it is significant to minimize the stroke of the transport arm by disposing such that the direction of substrate loading and unloading by the transport robot is perpendicular to the longitudinal direction of the lamp.

Accordingly, it is an object of the present invention to provide a thermal processing apparatus that is compact and excellent in maintainability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a diagram showing another example of the layout of a processing part and a transport robot.

DESCRIPTION OF THE PREFERRED EMBODIMENTS

Preferred embodiments of the present invention are now described in detail by referring to the accompanying drawings.

Figure 1:
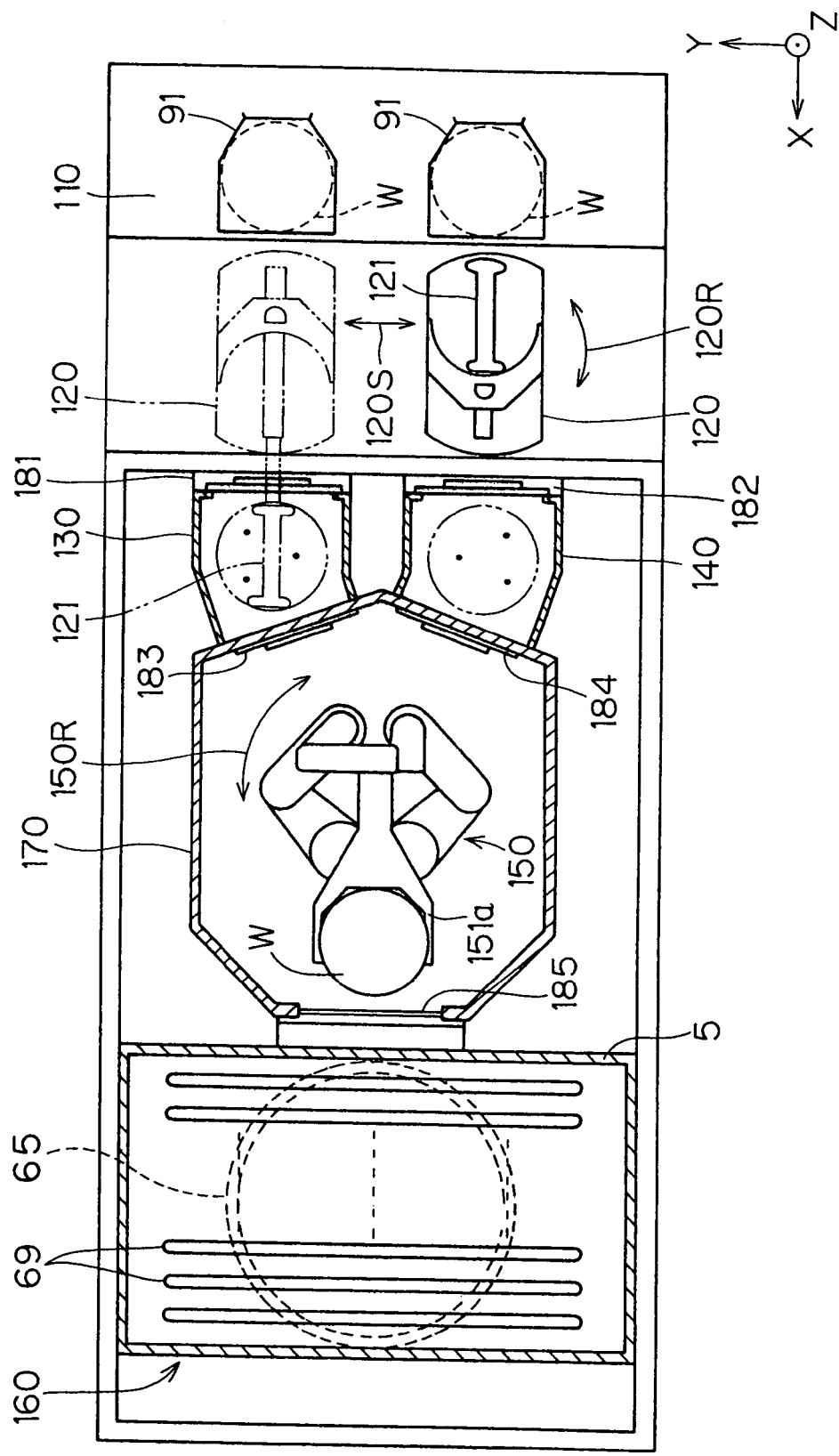
FIG. 1 is a plan view showing a thermal processing apparatus according to the present invention.
Figure 2:
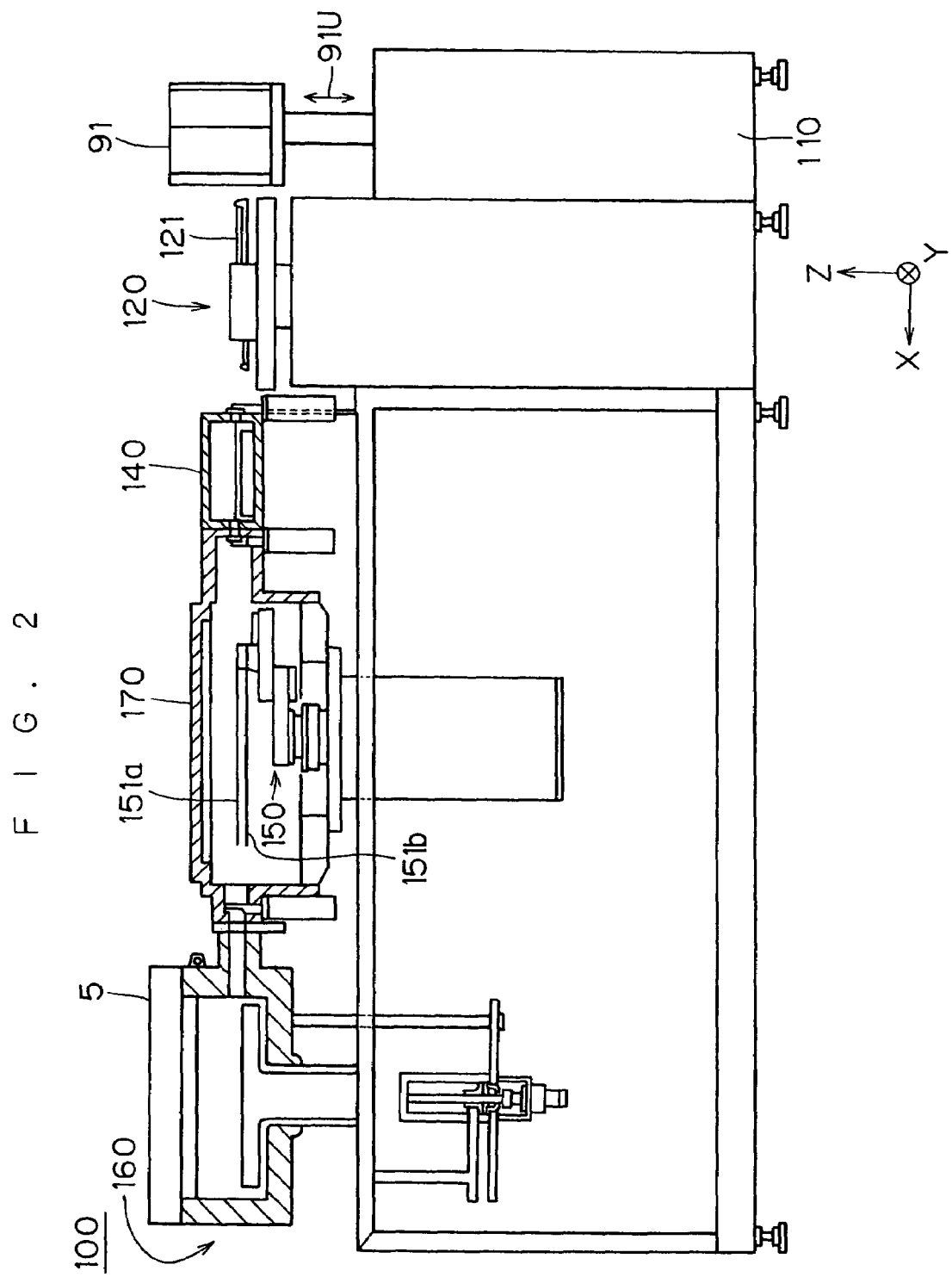
FIG. 2 is a front view showing the thermal processing apparatus of the present invention.

FIGS. 1 and 2 are a plan view and a front view, respectively, of a thermal processing apparatus 100 according to the present invention. For the sake of convenience, FIGS. 1 and 2 are partially shown in section, and the details are shown in simplified form. In order to clarify the directional relationship in FIGS. 1, 2, and the rest, where necessary, an XYZ rectangular coordinate system is appended, wherein the Z-axis direction is a vertical direction and an XY plane is a horizontal plane.

Referring to FIGS. 1 and 2, the thermal processing apparatus 100 has a substrate storing part (indexer) 110, on which two carriers 91 are mounted; a transfer robot 120 for loading and unloading a semiconductor wafer W with respect to the substrate storing part 110; a positioning part (aligner) 130 for positioning an untreated semiconductor wafer W; a cooling part (cooler) 140 for cooling a treated semiconductor wafer W; a transfer robot 150 for loading and unloading a semiconductor wafer W with respect to the positioning part 130, the cooling part 140 and the like; and a processing part 160 for subjecting a semiconductor wafer W to flash heat treatment.

There is further provided a transport room 170 for housing the transport robot 150 as a transport space of a semiconductor wafer W by the transport robot 150. The positioning part 130, the cooling part 140 and the processing part 160 are connected to the transport room 170.

The substrate storing part 110 is a section to which the carrier 91 is transported by an automatic guided vehicle (AGV) or the like and then mounted thereon. A semiconductor wafer W is, in the state of being stored in the carrier 91, loaded to and unloaded from the thermal processing apparatus 100. In the substrate storing part 110, the carrier 91 can be moved up and down such that the transfer robot 120 is capable of transferring any semiconductor wafer W.

The transfer robot 120 is capable of moving slidingly as indicated by a double-headed arrow 120S, and also is capable of rotating as indicated by a double-headed arrow 120R. Thereby, the transfer robot 120 transfers a semiconductor wafer W to the two carriers 91, and also transfers the semiconductor wafer W to the positioning part 130 and the cooling part 140.

The transfer of the semiconductor wafers W to/from the carriers 91 by the transfer robot 120 are executed by slidingly moving a hand 121 and the rise and fall of the carriers 91. The transfer of the semiconductor wafer W between the transfer robot 120 and the positioning part 130 or the cooling part 140 is executed by sliding movement of the hand 121 and by the rise and fall of the semiconductor wafers W with use of pins (i.e., the pins pushing up the semiconductor wafer W in the positioning part 130 and the cooling part 140).

The transfer robot 120 transfers a semiconductor wafer W to the positioning part 130 such that the center of the semiconductor wafer W is located at a predetermined position. The positioning part 130 rotates the semiconductor wafer W so as to face a proper direction.

The transport robot 150 is capable of turning around an axis extending vertically as indicated by a double-headed arrow 150R. The transport robot 150 has two link mechanisms each composed of a plurality of arm segments. Transport arms 151a and 151b for holding a semiconductor wafer W are provided at the ends of the two link mechanisms, respectively. The transport arms 151a and 151b are disposed one above the other a predetermined pitch apart, each of which is independently slidable linearly in the same horizontal direction. The transport robot 150 imparts up and down movement to a base on which the two link mechanisms are disposed, so that the two transport arms 151a and 151b move up and down with the predetermined pitch apart.

When the transport robot 150 performs transfer (loading/unloading) of a semiconductor wafer W with a transfer partner that is the positioning part 130, the processing part 160 or the cooling part 140, firstly, the transport arms 151a and 151b turn so as to oppose to the transfer partner, and then (or during the turn) moves up and down so that either of the transport arms is located at a height at which it performs transfer with the transfer partner. Thereafter, the transport arm 151a (151b) is slidingly moved linearly in a horizontal direction, thereby performing transfer of a semiconductor wafer W.

The processing part 160 is a section of performing heat treatment by irradiating the flashlight from xenon flash lamps 69 (hereinafter also referred to simply as "flash lamps 69") to a semiconductor wafer W. The processing part 160 includes a lamp house 5 storing a plurality of flash lamps 69, which has a rectangular shape when viewed from above, and a cylindrical chamber 65 for storing the semiconductor wafer W, which is disposed under the lamp house 5. The processing part 160 will further be described later.

Since a semiconductor wafer W immediately after being subjected to the processing in the processing part 160 has a high temperature, the semiconductor wafer W is transferred to the cooling part 140 by the transport robot 150, followed by cooling. The semiconductor wafer W cooled in the cooling part 140 is then returned as a treated semiconductor wafer W to the carrier 91 by the transfer robot 120.

As described previously, in the thermal processing apparatus 100, the transport room 170 surrounds the periphery of the transport robot 150. The positioning part 130, the cooling part 140 and the processing part 160 are connected to the transport room 170. Gate valves 181 and 182 are provided between the transfer robot 120 and the positioning part 130, or the cooling part 140. Gate valves 183, 184 and 185 are provided between the transport room 170 and the positioning part 130 or the cooling part 140 or the processing part 160. From a nitrogen gas supply part (not shown), high purity nitrogen gas is supplied to the insides of the positioning part 130, the cooling part 140 and the transport room 170 such that they are kept clean, and an excess nitrogen gas is exhausted through an exhaust pipe. These gate valves are properly opened and closed when a semiconductor wafer W is transferred.

The positioning part 130 and the cooling part 140 are located at different positions between the transfer robot 120 and the transport robot 150. A semiconductor wafer W is temporarily mounted for positioning in the positioning part 130. A treated semiconductor wafer W is temporarily mounted for cooling in the cooling part 140.

Figure 3:
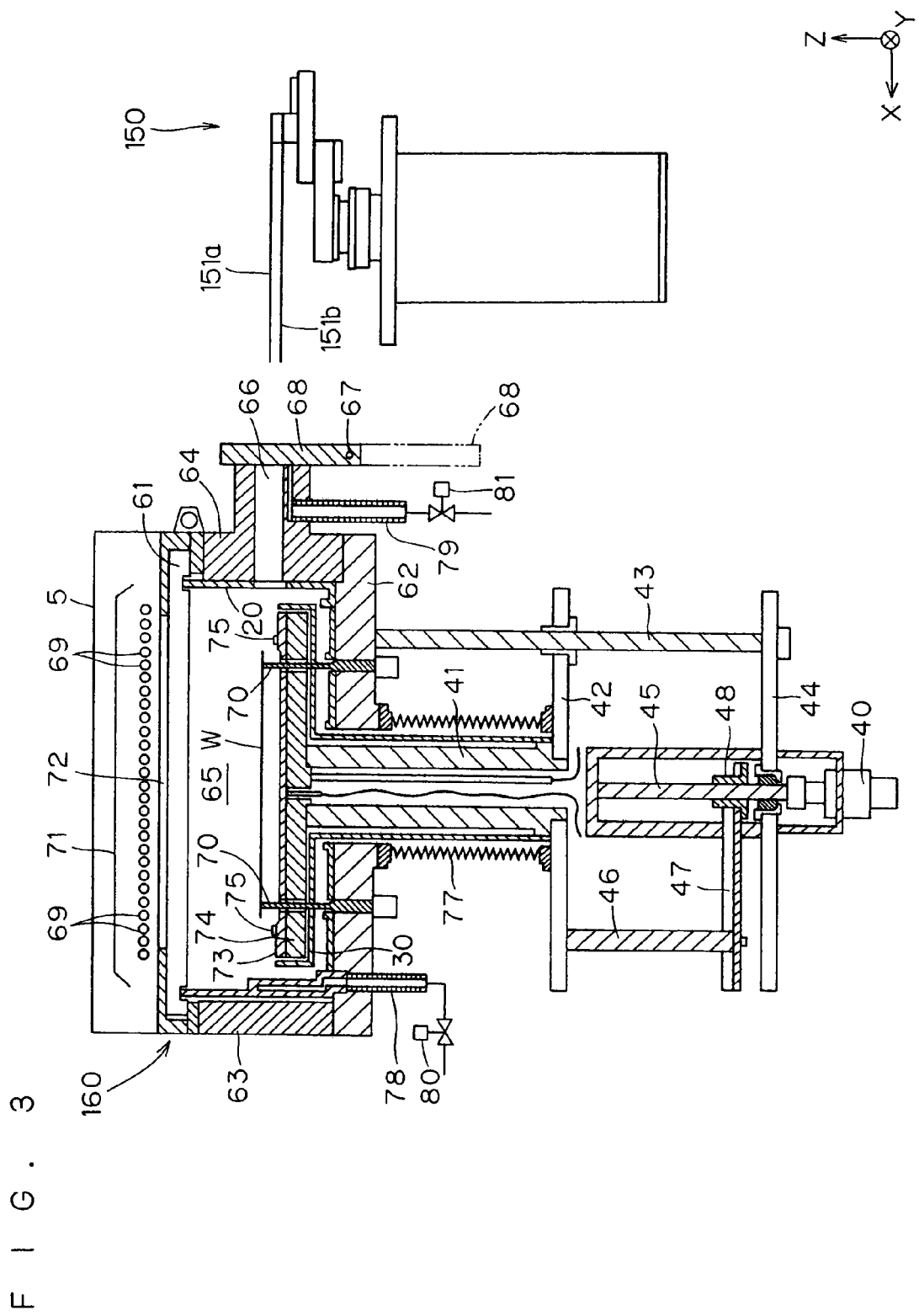
FIG. 3 is a side sectional view showing a processing part of the thermal processing apparatus in FIGS. 1 and 2.
Figure 4:
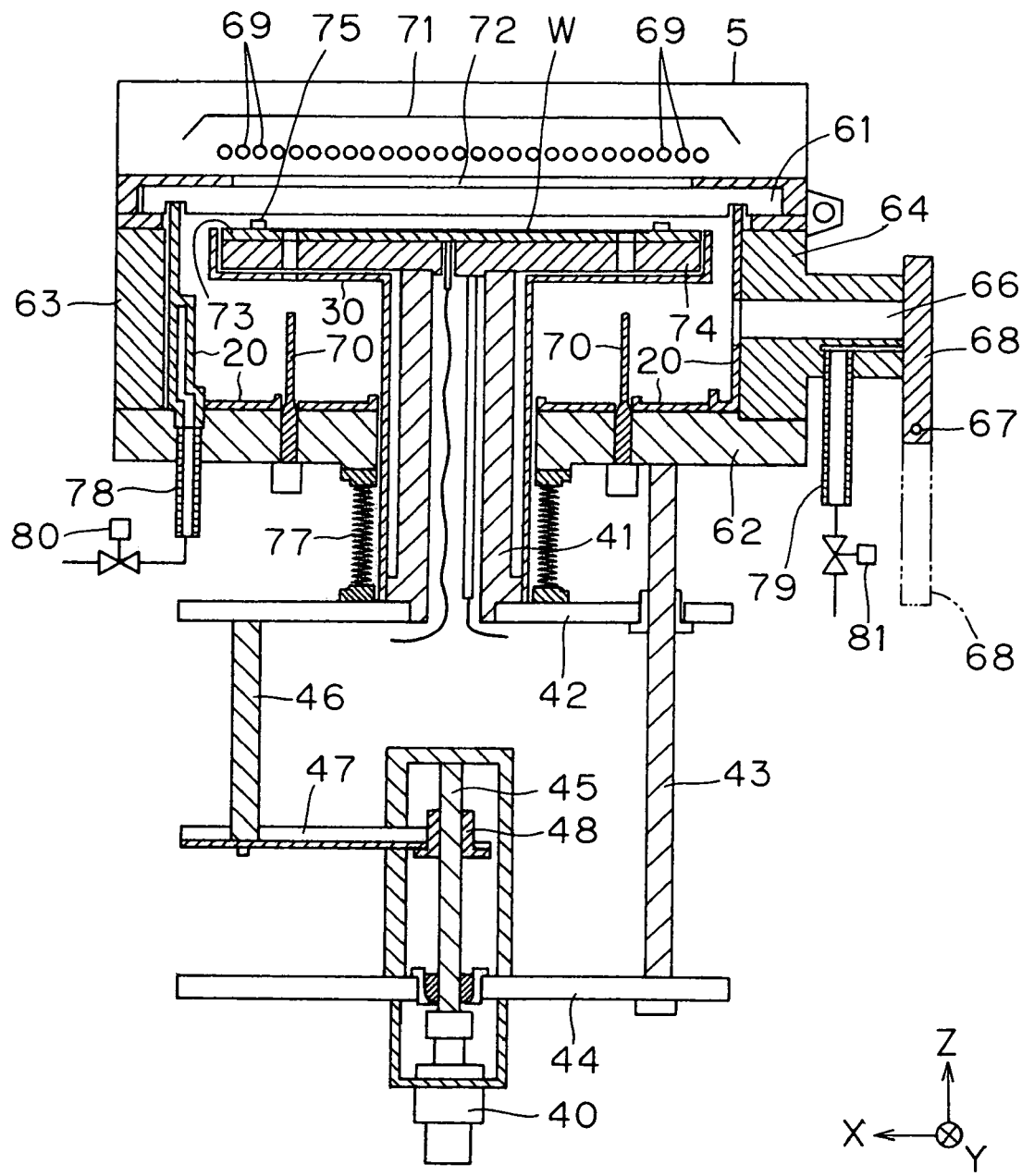
FIG. 4 is another side sectional view showing the thermal processing apparatus in FIGS. 1 and 2;.

Next, the construction of the processing part 160 will be further described. FIGS. 3 and 4 are side sectional views showing the processing part 160 of the thermal processing apparatus 100 according to the present invention. Flash heating of substrates such as semiconductor wafers and the like is performed in the processing part 160.

The processing part 160 comprises a chamber 65 for heat treatment of a semiconductor wafer W stored therein. The chamber 65 is formed by a translucent plate 61, a bottom plate 62 and a pair of side plates 63, 64. The chamber 65 has a substantially cylindrical shape. The translucent plate 61 forming an upper part of the chamber 65 is composed of light-transparent material such as quarts. The translucent plate 61 functions as a chamber window through which the light emitted from the flash lamps 69 is transmitted and introduced into the chamber 65. Support pins 70 are disposed vertically on the bottom plate 62 forming the chamber 65. The support pins 70 pass through a holding means consisting of a susceptor (wafer supporting member) 73 and a heating plate 74, each being described later, and support a semiconductor wafer W from the lower surface thereof.

An opening part 66, through which a semiconductor wafer W is loaded and unloaded, is formed in the side plate 64 forming the chamber 65. The opening part 66 can be opened and closed by the gate valve 68 rotating around the axis 67. The semiconductor wafer W is loaded, with the opening part 66 opened, into the chamber 65 by the transport robot 150. The gate valve 68 closes the opening part 66 when the semiconductor wafer W is subjected to thermal processing in the chamber 65.

The chamber 65 is disposed under the lamp house 5. The lamp house 5 contains a plurality of flash lamps 69 (twenty-seven pieces in this preferred embodiment) and a reflector 71. The lamp house 5 is a casing that has a rectangular shape when viewed from above. The plurality of flash lamps 69 are bar-like lamps each having an elongated cylindrical shape and are arranged in parallel to one another such that their respective longitudinal directions extend in a horizontal direction. The reflector 71 is disposed above the flash lamps 69 so as to cover all of them.

Figure 5:
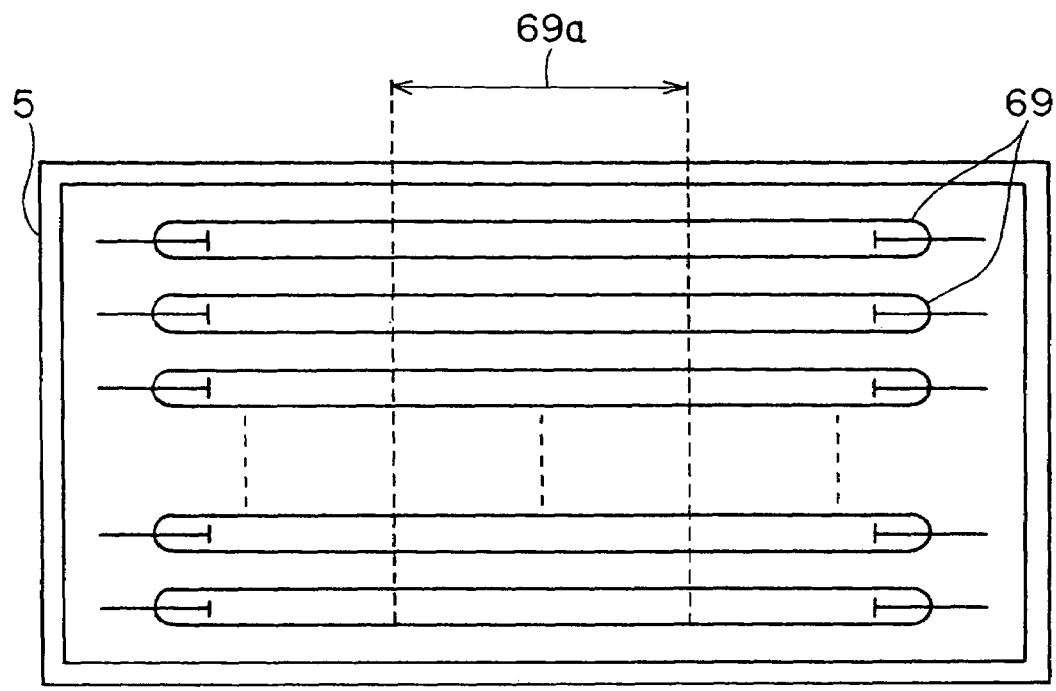
FIG. 5 is a diagram for explaining an array style of xenon flash lamps.
Figure 5:
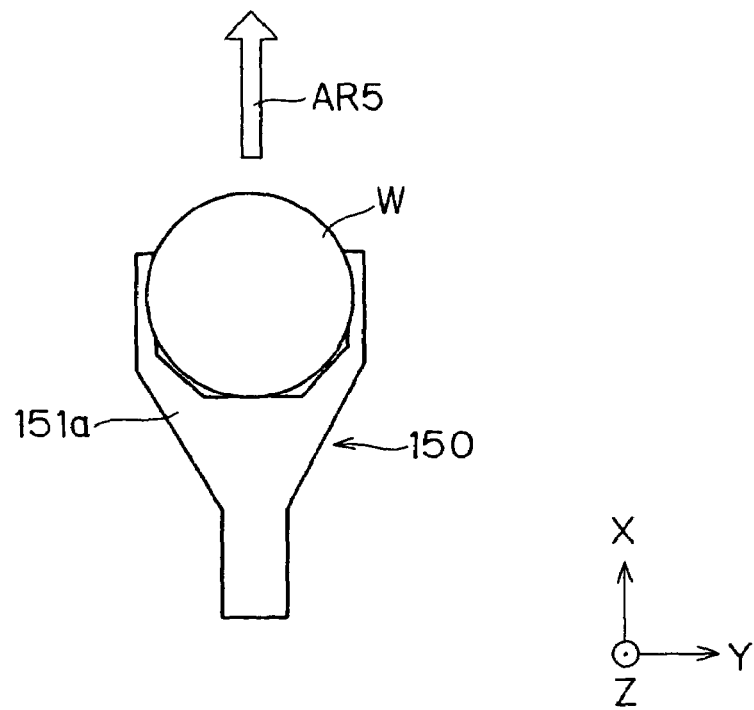

FIG. 5 is a diagram for explaining an array style of the xenon flash lamps 69. The lamp house 5 houses twenty-seven flash lamps 69 in the following array that their respective longitudinal directions extends in a horizontal direction (Y-direction in this preferred embodiment) and the twenty-seven flash lamps 69 are disposed in parallel to one another and at equally spaced intervals in a horizontal direction (X-direction) perpendicular to their respective longitudinal directions.

Each xenon flash lamp 69 has a glass tube filled with xenon gas, both ends of which are respectively provided with an anode and a cathode that are connected to a condenser, and a trigger electrode that is wound around the peripheral part of the glass tube. Xenon gas is electrically insulator and no current flows in the glass tube in the normal state. However, when a high voltage is applied to the trigger electrode in order to break insulation, the current stored in the condenser flows momentarily in the glass tube, and Joule heat generated at that time heats the xenon gas to emit light. In the xenon flash lamp 69, electrostatic energy previously stored is converted to extremely short optical pulses of 0.1 milliseconds to 10 milliseconds. Therefore, the flash lamp 69 has a characteristic of being able to irradiate extremely more intense light than a lamp source of continuous lighting.

Hereat, each xenon flash lamp 69 does not have a uniform output characteristics in the longitudinal direction unlike a conventional infrared lamp heater, but has effective output characteristics only at a central region 69a. That is, because of the characteristic of the xenon flash lamp 69, sufficient output intensity cannot be obtained in the area within a certain distance from the electrode. Electrode fixing part and the like are also required in addition to such insufficient intensity area. As the result, the length of the flash lamp 69 required for processing, for example, a semiconductor wafer having a diameter of 300 mm is as long as about 900 mm. On the other hand, regarding the array direction of the flash lamp 69 (the X-direction), it is only required to arrange a number of the flash lamps 69 for sufficiently covering the semiconductor wafer, and the distance between the lamps on the opposite ends is about 400 mm at the most. Accordingly, the lamp house 5 housing the flash lamps 69 naturally has a rectangular shape, the longitudinal direction of which corresponds to the longitudinal direction of the flash lamps 69. In the above-mentioned case, the lamp house 5 has such a size of 950 mm in the Y-direction that is the longitudinal direction, and about 450 mm in the X-direction that is the transverse direction.

The chamber 65 having such a size as to house a semiconductor wafer W is sufficient. In the case of processing a semiconductor wafer W having a diameter of 300 mm, the outside diameter of the chamber 65 is about 450 mm. That is, the outside diameter of the chamber 65 is approximately the same as the transverse direction length of the lamp house 5. The length of the flash lamp 69 and the longitudinal direction length of the lamp house 5 are not less than two times the inside diameter of the chamber 65 (the diameter of an upper opening).

Hence, this preferred embodiment employs such a layout that the loading and unloading directions of a semiconductor wafer W by the transport robot 150, as indicated by an arrow AR5 in FIG. 5, is perpendicular to the longitudinal direction of the flash lamps 69 (i.e., the longitudinal direction of the lamp house 5). This layout minimizes the necessary distance that the transport robot 150 transfers a semiconductor wafer W by slidingly moving the transport arms 151a and 151b. As the result, the transport robot 150 and the transport room 170 can be made compact, thus leading to a compact thermal processing apparatus 100. Further, transport robot 150 and the processing part 160 need not be disposed repetitively, thereby facilitating the maintenance of the thermal processing apparatus 100.

Returning to FIGS. 3 and 4, a light diffuser 72 is disposed between the lamp house 5 and the translucent plate 61. The light diffuser 72 is formed by performing light diffusion processing of the surface of a quartz glass as an infrared-transparent material.

Part of the light emitted from each flash lamp 69 passes directly through the light diffuser 72 and the translucent plate 61 into the chamber 65. Other part of the light emitted from the flash lamp 69 is first reflected by the reflector 71 and then passes through the light diffuser 72 and the translucent plate 61 into the chamber 65.

A disk-like heating plate 74 and a susceptor 73 supporting a semiconductor wafer W are disposed in the chamber 65. The susceptor 73 is stuck on an upper surface of the heating plate 74. A pin 75 for preventing dislocation of a semiconductor wafer W is provided on the surface of the susceptor 73.

The heating plate 74 is used for preheating (i.e., assist heating) a semiconductor wafer W. The heating plate 74 is made of aluminum nitride and has in its inside a heater and a sensor for controlling the heater. On the other hand, the susceptor 73 is used to preheat uniformly a semiconductor wafer W by diffusing thermal energy from the heating plate 74. As a material of the susceptor 73, there may be applied high purity ceramics or quartz, etc.

It is configured such that a motor 40 drives the susceptor 73 and the heating plate 74 to move up and down between loading and unloading positions of a semiconductor wafer W, as shown in FIG. 3, and a thermal processing position of the semiconductor wafer W, as shown in FIG. 4.

Specifically, the heating plate 74 is connected via a cylindrical body 41 to a movable plate 42. A guide member 43 suspended from the bottom plate 62 of the chamber 65 guides the movable plate 42 so as to be able to move up and down. A stationary plate 44 is fixed to a lower end part of the guide member 43, and the motor 40 that drives a ball screw 45 to rotate is disposed at a central part of the stationary plate 44. The ball screw 45 is screwed on a nut 48 connected via connecting members 46 and 47 to the movable plate 42. Thus, by the driving of the motor 40, the susceptor 73 and the heating plate 74 can move up and down between the loading and unloading positions shown in FIG. 3, and the thermal processing position shown in FIG. 4.

The loading and unloading positions of a semiconductor wafer W shown in FIG. 3 correspond to a position obtained when the susceptor 73 and the heating plate 74 are lowered in order that a semiconductor wafer W to be loaded through the opening part 66 by the transport robot 150 is mounted on the support pins 70 or the semiconductor wafer W mounted on the support pins 70 is unloaded through the opening part 66. In this state, the upper end of the support pins 70 passes through each through hole formed in the susceptor 73 and the heating plate 74, and then projects beyond the surface of the susceptor 73.

On the other hand, the thermal processing position of a semiconductor wafer W shown in FIG. 4 corresponds to a position obtained when the susceptor 73 and the heating plate 74 are raised above the upper end of the support pins 70 in order to perform thermal processing of the semiconductor wafer W. In the process that the susceptor 73 and the heating plate 74 move up from the loading and unloading positions in FIG. 3 to the thermal processing position in FIG. 4, the semiconductor wafer W mounted on the support pins 70 is received by the susceptor 73, and raised with its lower surface supported by the surface of the susceptor 73, and then held in a horizontal position at a location close to the translucent plate 61 in the chamber 65. In contrast, in the process that the susceptor 73 and the heating plate 74 move down from the thermal processing position to the loading and unloading positions, the semiconductor wafer W supported by the susceptor 73 is transferred to the support pins 70.

When the susceptor 73 and the heating plate 74 that hold the semiconductor wafer W are raised to the thermal processing position, the translucent plate 61 is located between the semiconductor wafer W held by them and the lamp house 5. Note that the distance between the susceptor 73 and the lamp house 5 at that time is adjustable to any value by controlling the amount of rotation of the motor 40.

Between the bottom plate 62 of the chamber 65 and the movable plate 42, there is disposed an extensible bellows 77 that surrounds the periphery of the cylindrical body 41 so as to maintain the chamber 65 in an airtight state. The bellows 77 shrinks when the susceptor 73 and the heating plate 74 have been raised to the thermal processing position, and it extends when they have been lowered to the loading and unloading positions, thereby separating the atmosphere of the chamber 65 from the external atmosphere.

An introduction path 78 connected in communication to a switching valve 80 is formed in a side plate 63 that is disposed the opposite side of the opening part 66 in the chamber 65. Through the introduction path 78, gas required for processing such as inactive nitrogen gas is introduced into the chamber 65. A discharge path 79 connected in communication to a switching valve 81 is formed in the opening part 66 of the side plate 64. The discharge path 79 is used to exhaust the gas in the chamber 65 and connected via the switching valve 81 to an exhaust means (not shown).

The following is a thermal processing operation of a semiconductor wafer W in the thermal processing apparatus 100 according to the present invention. The semiconductor wafer W that is a processing object of the thermal processing apparatus 100 is a semiconductor wafer after being subjected to ion implantation. After a description is given of a wafer flow in the entire thermal processing apparatus 100, the processing contents in the processing part 160 will be described in detail.

In the thermal processing apparatus 100, first, a plurality of semiconductor wafers W after being subjected to ion implantation, which are in the state of being stored in the carrier 91, are mounted on the substrate storing part 110. Then the transfer robot 120 takes the semiconductor wafers W one by one from the carrier 91, and transfers them to the positioning part 130.

The semiconductor wafer W positioned in the positioning part 130 is taken into the transport room 170 by the upper transport arm 151a of the transport robot 150, and the transport robot 150 turns and faces the processing part 160.

At the moment that the transport robot 150 faces the processing part 160, the lower transport arm 151b takes the preceding treated semiconductor wafer W from the processing part 160, and the upper transport arm 151a loads an untreated semiconductor wafer W into the processing part 160. At this moment, the transport robot 150 slidingly moves the transport arms 151a and 151b in a direction perpendicular to the longitudinal direction of the flash lamps 69 (the longitudinal direction of the lamp house 5).

Subsequently, the transport robot 150 turns and faces the cooling part 140, and the lower transport arm 151b transfers the treated semiconductor wafer W to the cooling part 140. The semiconductor wafer W cooled in the cooling part 140 is then returned to the carrier 91 by the transfer robot 120.

The description of the processing operation in the processing part 160 is now continued. In the processing part 160, in the state that the susceptor 73 and the heating plate 74 are in the loading and unloading positions of a semiconductor wafer W shown in FIG. 3, the semiconductor wafer W is loaded through the opening part 66 by the transport robot 150 and then mounted on the support pins 70. At the completion of the loading of the semiconductor wafer W, the gate valve 68 closes the opening part 66. Thereafter, the motor 40 drives the susceptor 73 and the heating plate 74 to move up to the thermal processing position of a semiconductor wafer W shown in FIG. 4, and then holds it in a horizontal position. Also, the switching valves 80 and 81 are opened to form a gas flow of nitrogen gas in the chamber 65.

The susceptor 73 and the heating plate 74 are preheated to a predetermined temperature by the action of the heater contained in the heating plate 74. Therefore, when the susceptor 73 and the heating plate 74 are in the thermal processing position of the semiconductor wafer W, the semiconductor wafer W is preheated by making contact with the susceptor 73 in its preheated state, so that the temperature of the semiconductor wafer W increases gradually.

In this state, the semiconductor wafer W is continuously heated through the susceptor 73. During the time that the temperature of the semiconductor wafer W is increasing, a temperature sensor (not shown) provided in the heating plate 74 always monitors whether or not the inside temperature of the heating plate 74 reaches such a setting temperature that the surface temperature of the semiconductor wafer W reaches a preheating temperature T1.

The preheating temperature T1 is, for example, about 200° C. to about 600° C. Even when the semiconductor wafer W is heated to the preheating temperature T1 in this temperature range, the ions implanted into the semiconductor wafer W do not diffuse.

Then, when the surface temperature of the semiconductor wafer W reaches the preheating temperature T1, the flash lamps 69 light up to perform flash heating. The lighting time of the flash lamps 69 in the flash heating step is about 0.1 milliseconds to about 10 milliseconds. Thus, extremely intense flashlight can be irradiated from the flash lamps 69 because the static energy previously stored is converted to such short optical pulses.

The surface temperature of the semiconductor wafer W momentarily reaches temperature T2 by the flash heating. Temperature T2 is about 1000° C. to about 1100° C., which is required for ion activation processing of the semiconductor wafer W. Elevating the temperature of the surface of the semiconductor wafer W to the processing temperature T2 can activate the ions implanted into the semiconductor wafer W.

At this time, the surface temperature of the semiconductor wafer W is elevated to the processing temperature T2 in an extremely short time of about 0.1 milliseconds to about 10 milliseconds, thereby completing the activation of the ions in the semiconductor wafer W in a short period of time. Therefore, the ions implanted into the semiconductor wafer W do not diffuse, thereby avoiding the phenomenon that the profile of the ions implanted into the semiconductor wafer W becomes round. Note that since the time required for ion implantation is extremely shorter than the time required for ion diffusion, the ion activation is completed even in such a short period of time, about 0.1 milliseconds to about 10 milliseconds, which is too short to cause diffusion.

Before the flash lamps 69 light up to heat the semiconductor wafer W, the surface temperature of the semiconductor wafer W is already heated to the preheating temperature T1 of about 200° C. to about 600° C., by use of the heating plate 74. It is therefore possible to quickly elevate the semiconductor wafer W to the processing temperature T2 of about 1000° C. to about 1100° C., by use of the flash lamps 69.

After the flash heating step is terminated, the motor 40 drives the susceptor 73 and the heating plate 74 to move down to the loading and unloading positions of the semiconductor wafer W shown in FIG. 3. At the same time the opening part 66 that has been closed by the gate valve 68 is opened. The semiconductor wafer W mounted on the support pins 70 is unloaded by the transport robot 150. Thus, a sequence of the thermal processing operation is completed.

As described above, this preferred embodiment employs such a layout that the direction of loading and unloading of the semiconductor wafer W by the transport robot 150 is perpendicular to the longitudinal direction of the flash lamps 69 (the longitudinal direction of the lamp house 5). For example, such a layout that the lamp house 5 is inclined, or alternatively the longitudinal direction thereof is parallel to the direction of loading and unloading of the semiconductor wafer W by the transport robot 150, elongates the distance of sliding motion of the transport arms 151a and 151b, which is required for the transport robot 150 to load and unload the semiconductor wafer W with respect to the effective irradiation region of the flash lamps 69. As the result, the transport robot 150 and the transport room 170 have a large size thereby to increase the size of the thermal processing apparatus 100 itself.

In such a layout of incorporating part of the transport robot 150 into the processing part 160, the semiconductor wafer W can be loaded and unloaded with respect to the effective irradiation region, without increasing the size of the transport robot 150. However, this layout complicates the construction, so that the maintenance of both of the processing part 160 and the transport robot 150 becomes difficult.

In contrast, this preferred embodiment minimizes the distance required for the transport robot 150 to transfer a semiconductor wafer W by slidingly moving the transport arms 151a and 151b. It is therefore capable of loading and unloading a semiconductor wafer W with respect to the effective irradiation region, without employing the layout of increasing the size of the transport robot 150 and incorporating part of the transport robot 150 into the processing part 160. As the result, the transport robot 150 and the transport room 170 can be made compact, so that the thermal processing apparatus 100 itself can be made compact. Additionally, since the transport robot 150 and the processing part 160 can be disposed separately, the maintenance of the thermal processing apparatus 100 is facilitated. There are also provided electrode fixing parts for the flash lamps 69 on both ends in the longitudinal direction of the lamp house 5. The layout of this preferred embodiment avoids the interference between the electrode fixing parts and the transport robot 150.

Furthermore in this preferred embodiment, the substrate storing part (indexer) 110, the transport robot 150 and the processing part 160 are aligned in the order named in the direction of loading and unloading of a semiconductor wafers W by the transport robot 150. If the transport robot 150 can be made compact, the overall length of the thermal processing apparatus 100 itself in this alignment can also be reduced.

While the preferred embodiment of the present invention has been described, this preferred embodiment is illustrative and should not be viewed as limiting the present invention. For example, although in the foregoing preferred embodiment, the lamp house 5 is provided with twenty-seven flash lamps 69, without limiting to this, the number of flash lamps 69 may be determined at will.

Although in the foregoing preferred embodiment the two carriers 91 are mounted in the substrate storing part 110, the number of the carrier 91 may be only one, or not less than three. Although the transfer robot 120 moves between the two carriers 91, two transfer robots 120 may be provided.

In an alternative, the upper transport arm 151a of the transport robot 150 may be designed as an arm for holding an untreated semiconductor wafer W, and the lower transport arm 151b may be designed as an arm for holding a treated semiconductor wafer W. Thereby it is capable of miniaturizing the transport robot 150 and improving the reliability of transport.

Referring to FIG. 6, a plurality of processing parts 160 may be disposed in the surroundings of the transport robot 150. In the example of FIG. 6, three processing parts 160 are disposed in three directions of the transport robot 150, that is, disposed 90° apart around the transport robot 150. Each of the processing parts 160 is arranged so that the direction of loading and unloading of semiconductor wafers W by the transport robot 150 is perpendicular to the longitudinal direction of the flash lamps 69 (the longitudinal direction of the lamp house 5). In the remaining direction the positioning part 130 and the cooling part 140 are disposed in the same manner as shown in FIG. 1. Even this layout produces the same effect as the foregoing preferred embodiment.

Although in the foregoing preferred embodiment the ion activation processing is executed by irradiating light to a semiconductor wafer, a substrate to be processed by the thermal processing apparatus of the present invention is not limited to a semiconductor wafer. For example, the thermal processing apparatus of the present invention may be used to process a glass substrate in which a variety of silicon films such as a silicon nitride film and a polycrystal silicon film are formed. As an example, to a polycrystal silicon film that is formed on a glass substrate by CVD method, ion implantation of silicon is performed to form an amorphous silicon film that is made into amorphous, and a silicon oxide film serving as an antireflection film is formed on the amorphous silicon film. In this state, the thermal processing apparatus of the present invention may perform light irradiation to the entire surface of the amorphous silicon film, thereby forming a polycrystal silicon film that is derived from polycrystallization of the amorphous silicon film.

In an alternative, to a TFT substrate, which is obtained by the step of forming on a glass substrate an underlayer oxide silicon film and a polysilicon film derived from the crystallization of amorphous silicon, and the step of doping impurities such as phosphor or boron into the polysilicon film, the thermal processing apparatus of the present invention may perform light irradiation to activate the impurities implanted in the doping step.

While the invention has been shown and described in detail, the foregoing description is in all aspects illustrative and not restrictive. It is therefore understood that numerous modifications and variations can be devised without departing from the scope of the invention.

What is claimed is:

1. A thermal processing apparatus for heating a substrate by irradiating flashlight to said substrate, comprising:
    a plurality of lamp houses, each lamp house storing a plurality of bar-like flash lamps in such a state that a longitudinal direction of each of said plurality of flash lamps extends in a substantially horizontal direction, and that said plurality of flash lamps are arranged in parallel in a substantially horizontal direction that is substantially perpendicular to said longitudinal direction;
    a plurality of chambers for storing a substrate, each chamber being disposed below each of said plurality of lamp houses; and
    a transport robot for loading and unloading a substrate by advancing and retracting a transport arm with respect to each of said plurality of chambers, wherein;
    all of said plurality of lamp houses are disposed such that a direction of substrate loading and unloading by said transport robot is substantially perpendicular to said longitudinal direction of said plurality of flash lamps.

2. The thermal processing apparatus according to claim 1, wherein
    said plurality of lamp houses are three lamp houses, and said three lamp houses are disposed 90° apart around said transport robot.

3. The thermal processing apparatus according to claim 2, wherein
    said plurality of flash lamps are xenon flash lamps.

4. A thermal processing apparatus for heating a substrate by irradiating flashlight to said substrate, comprising:
    a plurality of lamp houses of a rectangular shape, each lamp house storing a plurality of bar-like flash lamps in such a state that a longitudinal direction of each of said plurality of flash lamps extends in a longitudinal direction of said rectangular shape, and that said plurality of flash lamps are arranged in parallel in a substantially horizontal direction that is substantially perpendicular to said longitudinal direction of said rectangular shape;
    a plurality of chambers for storing a substrate, each chamber being disposed below each of said plurality of lamp houses; and
    a transport robot for loading and unloading a substrate by advancing and retracting a transport arm with respect to each of said plurality of chambers, wherein:
    all of said plurality of lamp houses are disposed such that a direction of substrate loading and unloading by said transport robot is substantially perpendicular to said longitudinal direction of said plurality of lamp houses.

5. The thermal processing apparatus according to claim 4, wherein
    said plurality lamp houses are three lamp houses, and said three lamp houses are disposed 90° apart around said transport robot.

6. The thermal processing apparatus according to claim 5, wherein
    said plurality of flash lamps are xenon flash lamps.

7. The thermal processing apparatus according to claim 1, wherein
    each of said plurality of chambers has a cylindrical shape and has a disk-like heating plate on which a substrate is mounted and preheated prior to irradiation of flashlight, and
    the length of each of said plurality of flash lamps is greater than the outside diameter of a corresponding one of said plurality of chambers.

8. The thermal processing apparatus according to claim 7, wherein
    the length of each of said plurality of flash lamps is not less than two times the inside dimension of a corresponding one of said plurality of chambers.

9. The thermal processing apparatus according to claim 4, wherein
    each of said plurality of chambers has a cylindrical shape and has a disk-like heating plate on which a substrate is mounted and preheated prior to irradiation of flashlight, and
    the length of said longitudinal direction of each of said plurality of lamp houses is greater than the outside diameter of a corresponding one of said plurality of chambers.

10. The thermal processing apparatus according to claim 9, wherein
    the length of each of said plurality of lamp houses in said longitudinal direction is not less than two times the inside dimension of a corresponding one of said plurality of chambers.

* * * * *